United States Patent
Ayazi et al.

(10) Patent No.: US 7,337,671 B2
(45) Date of Patent: Mar. 4, 2008

(54) CAPACITIVE MICROACCELEROMETERS AND FABRICATION METHODS

(75) Inventors: Farrokh Ayazi, Atlanta, GA (US); Babak Vakili Amini, Marietta, GA (US); Reza Abdolvand, Atlanta, GA (US)

(73) Assignee: Georgia Tech Research Corp., Atlanta, GA (US)

( * ) Notice: Subject to any disclaimer, the term of this patent is extended or adjusted under 35 U.S.C. 154(b) by 0 days.

(21) Appl. No.: 11/444,723

(22) Filed: Jun. 1, 2006

(65) Prior Publication Data
US 2006/0272414 A1    Dec. 7, 2006

Related U.S. Application Data

(60) Provisional application No. 60/686,981, filed on Jun. 3, 2005.

(51) Int. Cl.
*G01P 15/125* (2006.01)
(52) U.S. Cl. .................................. 73/514.32
(58) Field of Classification Search ............ 73/514.32, 73/514.36, 514.38, 504.02, 504.04, 504.12, 73/594.14, 514.16, 514.29
See application file for complete search history.

(56) References Cited

U.S. PATENT DOCUMENTS

| 6,117,701 A * | 9/2000 | Buchan et al. ................ 438/52 |
| 6,389,899 B1* | 5/2002 | Partridge et al. ......... 73/514.33 |
| 7,043,985 B2* | 5/2006 | Ayazi et al. ............. 73/504.04 |
| 7,109,727 B2* | 9/2006 | Hayakawa et al. ......... 324/679 |

* cited by examiner

*Primary Examiner*—Helen Kwok
(74) *Attorney, Agent, or Firm*—Kenneth W. Float

(57) ABSTRACT

Disclosed are moveable microstructures comprising in-plane capacitive microaccelerometers, with submicrogravity resolution (<200 ng/$\sqrt{Hz}$) and very high sensitivity (>17 pF/g). The microstructures are fabricated in thick (>100 μm) silicon-on-insulator (SOI) substrates or silicon substrates using a two-mask fully-dry release process that provides large seismic mass (>10 milli-g), reduced capacitive gaps, and reduced in-plane stiffness. Fabricated devices may be interfaced to a high resolution switched-capacitor CMOS IC that eliminates the need for area-consuming reference capacitors. The measured sensitivity is 83 mV/mg (17 pF/g) and the output noise floor is −91 dBm/Hz at 10 Hz (corresponding to an acceleration resolution of 170 ng/$\sqrt{Hz}$). The IC consumes 6 mW power and measures 0.65 mm$^2$ core area.

12 Claims, 9 Drawing Sheets

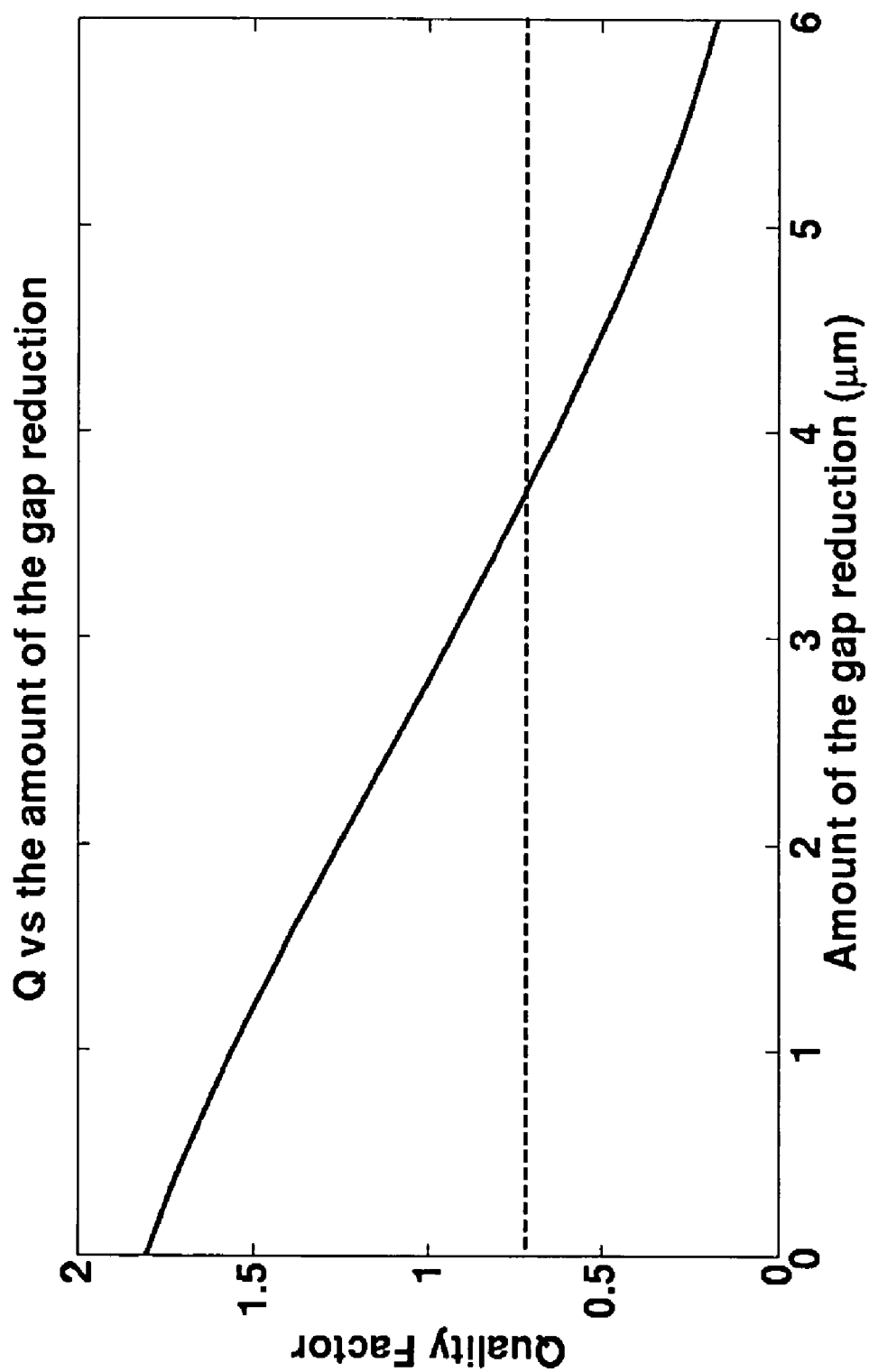

CAPACITIVE MICROACCELEROMETERS AND FABRICATION METHODS

This application claims the benefit of U.S. Provisional Application No. 60/686,98 1, filed Jun. 3, 2005.

STATEMENT REGARDING FEDERALLY SPONSORED RESEARCH OR DEVELOPMENT

This invention was made in part with government support under Grant Number NNC04GB18G awarded by National Aeronautics and Space Administration. Therefore, the government may have certain rights in this invention.

BACKGROUND

The present invention relates to microaccelerometers and methods for fabricating same.

Sub-micro-gravity accelerometers are used for measurement of very small vibratory disturbances on platforms installed on earth, space shuttles, and space stations as well as geophysical sensing and earthquake detection. However, the available systems are bulky, complex and expensive, and consume a lot of power. See, for example, Space Acceleration Measurement System (SAMS), http://microgravity.grc-.nasa.gov/MSD/MSDhtmlslsamsff.html.

Due to the low-cost and high volume demand, the majority of commercially available microaccelerometers have been developed with low to medium range sensitivities. However, in the past few years, there has been an increasing demand for low-power and small form-factor micro-gravity (micro-g) accelerometers for a number of applications including vibration measurement and earthquake detection. High-performance digital microelectromechanical system (MEMS) accelerometers may also be utilized in ultra-small size for large-volume portable applications such as laptop computers, pocket PCs and cellular phones.

Despite the substantial improvements in micro-fabrication technology, which have enabled commercialization of low to medium sensitivity micromechanical accelerometers, the high precision (<10 µg resolution) accelerometer market has not been dominated by micromachined devices. Moreover, there has been an increasing demand for low-power and small footprint MEMS accelerometers with high sensitivity and stability for many applications such as oil exploration, gravity gradiometry, and earthquake detection. Inexpensive mass-production of these sensitive devices in small size not only can target all these existing applications but also could open new opportunities for applications never been explored with today's available bulky and complex measurement systems.

To achieve the overall device resolution in the sub-µg regime, both mechanical and electronic noises must be extensively suppressed. The dominant source of mechanical noise is the Brownian motion of air molecules hitting the circumferential surfaces of the small micromachined device. Increasing the inertial mass of the sensor is the most effective way of improving the device performance. One implementation of this approach using the full thickness of the silicon wafer combined with high aspect ratio sense gaps has been demonstrated and proved viable in realization of micro-gravity micromechanical accelerometers. Narrow sense gaps in these multiple-mask double-sided processes are defined by a sacrificial oxide layer, which is removed in a wet oxide-etch step referred to as a release step. Considering compliance of the structure required for high intended sensitivity, the sensitivity of the device is limited by the stiction in the wet release step.

The present inventors have previously disclosed 40 µm thick SOI accelerometers with 20 µg/$\sqrt{Hz}$ resolution and sensitivity on the order of 0.2 pF/g. See B. Vakili Amini, S. Pourkamali, and F. Ayazi, "A high resolution, stictionless, CMOS-compatible SOI accelerometer with a low-noise, low-power, 0.25 µm CMOS interface," MEMS 2004, pp. 272-275. These accelerometers, however, do not have the structure or resolution capability of the present invention.

U.S. Pat. Nos. 6,287,885 and 6,694,814 disclose silicon-on-insulator devices designed as acceleration sensors. However, U.S. Pat. Nos. 6,287,885 and 6,694,814 do not disclose or suggest construction of an accelerometer having added seismic mass or the use of doped polysilicon to reduce capacitive gaps.

It would be desirable to have microaccelerometers that have improved submicron-gravity resolution.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 3e is a graph showing Q variation with respect to gap size for an exemplary accelerometer;

DETAILED DESCRIPTION

Disclosed herein are micro- and submicro-gravity capacitive micro-machined accelerometers 10 (FIGS. 1 and 2) interfaced to a low-power, low-noise reference-capacitor-less switched-capacitor interface circuit (FIG. 7a). The accelerometers 10 may be fabricated on relatively thick (>100 µm) silicon-on-insulator (SOI) substrates 11 (FIGS. 3a-3c) or on silicon substrates 11 (FIGS. 3d-3f) using a high-aspect ratio fully-dry release process sequence that provide a large seismic mass and reduced in-plane stiffness.

An SOI substrate is comprised of a silicon device layer, a buried oxide layer and a silicon handle layer. In the most general term, the silicon in the substrate can be replaced with other materials such as metals, including SiC and diamond. The resolution and sensitivity of fully-dry-released SOI accelerometers 10 are each improved by 100 times compare to earlier implementations to achieve, for the first time, deep sub-micro-gravity resolution in a small footprint (<0.5 cm$^2$).

Figure 1:
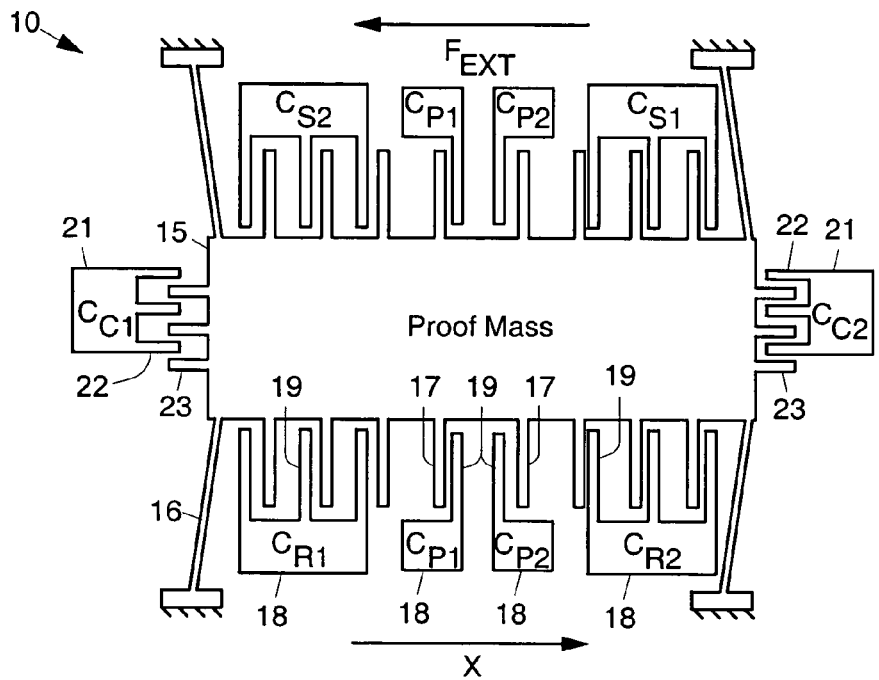
FIG. 1 is a schematic diagram of an exemplary differential capacitive SOI accelerometer.
Figure 2:
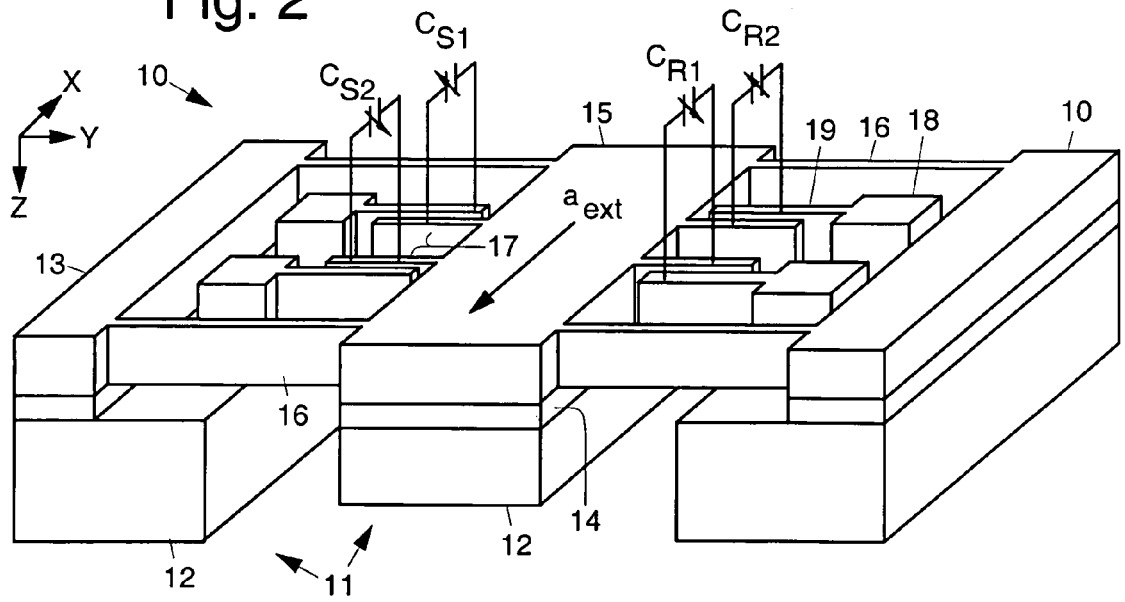
FIG. 2 is a three-dimensional view of an exemplary differential capacitive SOI accelerometer.
Figure 3A:
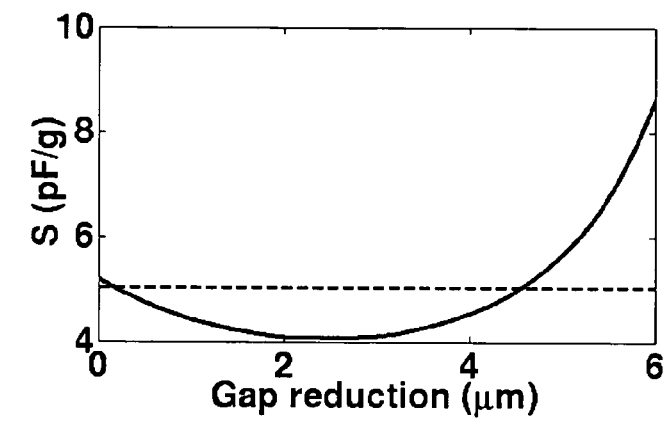
FIGS. 3a-3d are graphs showing design criteria for an exemplary accelerometer.
Figure 3B:
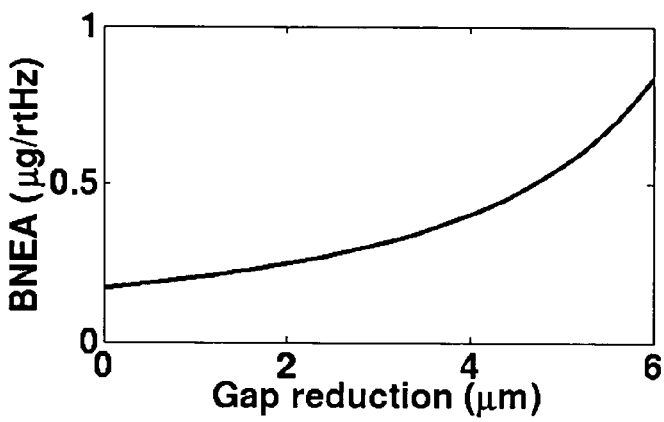
Figure 3C:
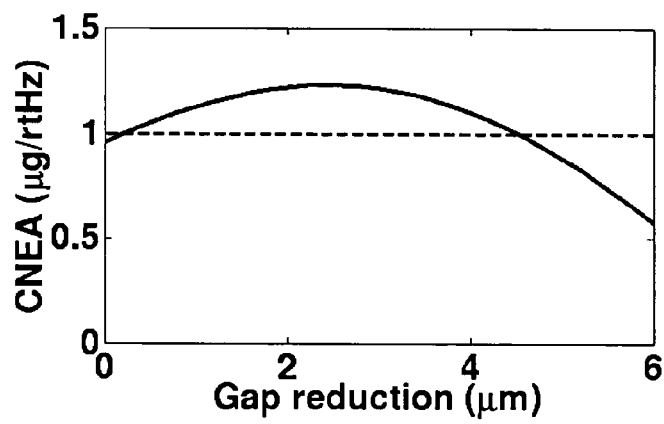
Figure 3D:
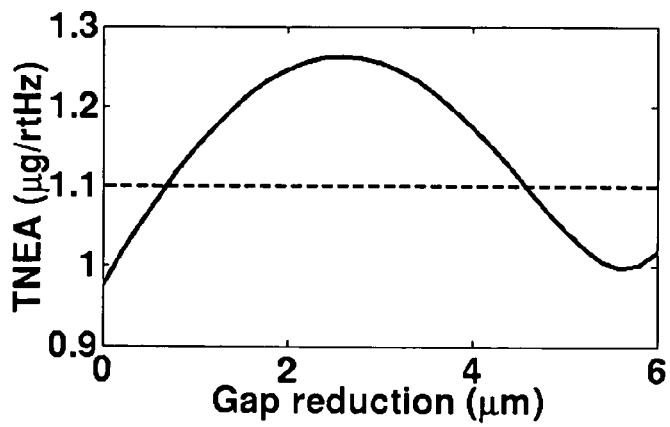

FIG. 1 is a schematic diagram of an exemplary differential capacitive SOI accelerometer 10. FIG. 2 is a three-dimensional view of an exemplary differential capacitive SOI accelerometer 10.

The exemplary differential capacitive SOI accelerometer 10 comprises a silicon-on-insulator substrate 11 or wafer 11 comprising a lower silicon handle layer 12 and an upper silicon layer 13 (or device layer 13) separated by an insulating layer 14. The upper silicon layer 13 or device layer 13 is fabricated to comprise a proof mass 15 having a plurality of tethers 16 extending therefrom to an exterior portion of the upper silicon layer 13 or device layer 13 that is separated from the proof mass 15. A portion of the insulating layer 14 and lower silicon handle layer 12 of the wafer 11 is attached to the proof mass 15 to provide added mass for the accelerometer 10. The proof mass 15 also has a plurality of fingers 17 extending laterally therefrom. A plurality of electrodes 18 having readout fingers 19 extending therefrom are disposed adjacent to and separated from the plurality of fingers 17 extending from the proof mass 15. Variable capacitors are formed between respective adjacent pairs of fingers 17, 19 of the proof mass 15 and electrodes 18. As is shown in FIG. 1, a plurality of comb drive electrodes 21 having a plurality of fingers 22 to are interposed between comb drive fingers 23 extending from the proof mass 15. The comb drive electrodes 21 are not shown in FIG. 2.

One unique aspect of the present accelerometers 10 is the fact that it has added proof mass 15 comprising portion of the insulating layer 14 and lower silicon handle layer 12. This provides for improved submicro-gravity resolution. Another unique aspect of the accelerometers 10 is that sense gaps between adjacent fingers 17, 19 are very small, on the order of 9 μm.

Specifications for the accelerometer 10 are presented in Table 1. The accelerometer 10 has been designed to achieve the goal objectives for open loop operation in air.

TABLE 1

| Specifications | |
| --- | --- |
| Static sensitivity | >5 pF/g |
| Brownian noise floor | <200 ng$_\nu$/Hz |
| Dynamic range | >100 dB |
| Frequency range | <200 Hz |
| Quality factor | <1 |
| SOI thickness | >100 μm |
| Proof mass size | 5 mm × 7 mm |
| Overall sensor size | 7 mm × 7 mm |
| Mass | >10 milligram |

The Brownian noise-equivalent acceleration (BNEA) may be expressed as $$BNEA = \frac{\sqrt{4k_B TD}}{M} = \sqrt{\frac{4k_B T\omega_0}{MQ}} \propto \frac{1}{(capacitive gap)^{3/2}} \quad (1)$$

where $K_B$ is the Boltzmann constant, T is the absolute temperature, $\omega_0$ is the natural angular frequency (first flexural mode) of the accelerometer 10, and Q is the mechanical quality factor. Increasing the mass and reducing the air damping improves this mechanical noise floor. However, reducing the damping increases the possibility of resonance (high-Q) and sensitivity to higher order modes, which is not desirable. Another limiting factor is the circuit noise equivalent acceleration (CNEA) that depends on the capacitive resolution of the interface IC ($\Delta C_{MIN}$) and the capacitive sensitivity (S) of the accelerometer 10:

$$CNEA = \frac{\Delta C_{min}}{S} \left[\frac{m/s^2}{\sqrt{Hz}}\right] \quad (2)$$

The design objective is to minimize the Brownian noise equivalent acceleration (BNEA) and to maximize the static sensitivity (S) while satisfying process simplicity and size limitations. The exemplary fabrication process (FIGS. 3a-3c) enables increase of the seismic mass 15 (to suppress the BNEA) and reduction of gap sizes (to increase S and reduce Q), independently. BNEA is a function of capacitive gap size and reduces for larger gaps (Equation 1). A deposited polysilicon layer 27 (or conformal conductive layer 27) changes the thickness of the tethers 16 as well, which causes the mechanical compliance and therefore the sensitivity to start increasing for thinner polysilicon layers 27.

FIGS. 3a-3d are graphs showing design criteria for an exemplary accelerometer. FIG. 3e is a graph showing Q variation with respect to gap size for an exemplary accelerometer. A capacitive gap size between 4 and 8 μm satisfies the BNEA and S requirements for the accelerometer 10. However, the Q for the accelerometer 10 should be in the overdamped region. Since the seismic mass 11 is relatively large (tens of milligrams) and the accelerometer 10 is very compliant, the accelerometer 10 may be vulnerable to damage caused by mechanical shock. Hence, shock stops and deflection limiters may be used to protect the accelerometer 10 and avoid nonlinear effects caused by momentum of the off-plane center of mass. ANSYS® simulation predicts the first mode shape (in-plane flexural) to occur at 180 Hz and the next mode shape (out-of-plane motion) to occur at 1300 Hz, which is well above the in-plane motion.

Figure 4A:
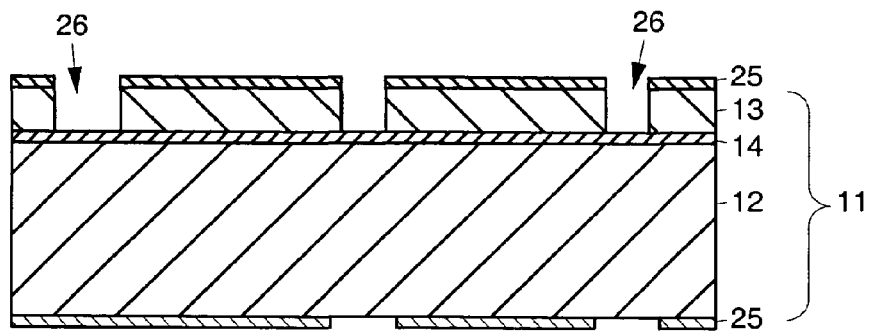
FIGS. 4a-4c illustrate an exemplary fabrication process flow for producing a differential capacitive SOI accelerometer.
Figure 4B:
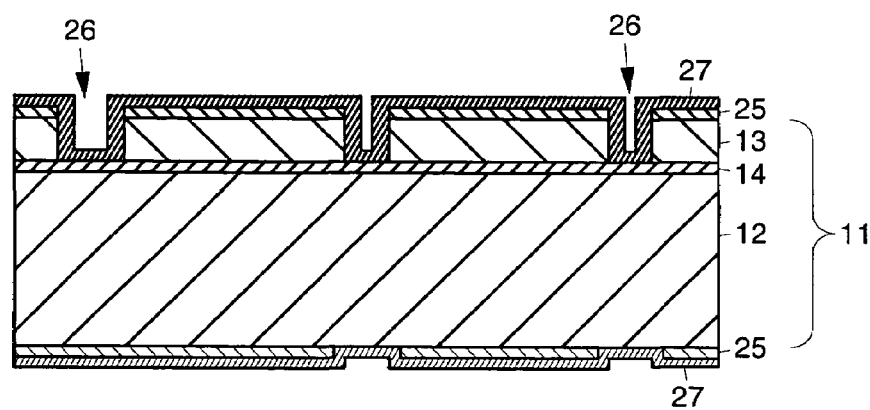
Figure 4C:
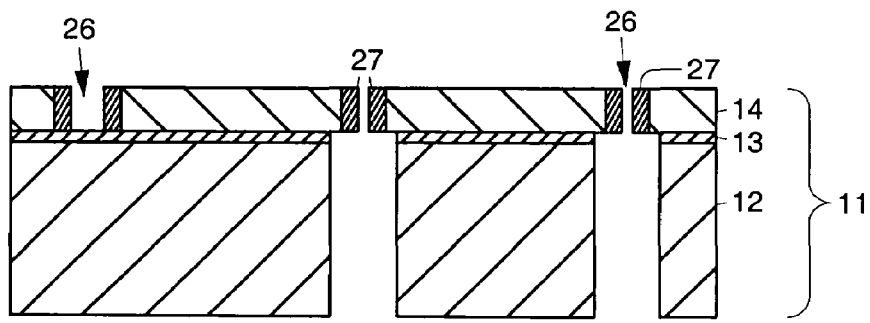

FIGS. 4a-4c illustrate an exemplary two-mask fabrication process or method for fabricating exemplary SOI accelerometers 10. The accelerometer fabrication process flow is as follows.

As is shown in FIG. 4a, a relatively thick silicon oxide layer 25 is deposited/grown on either one or both sides of a low resistivity relatively thick SOI wafer 11 (substrate 11) comprising the silicon handle layer 12 and device layer 13) separated by the insulating layer 14. The oxide layer 25 is patterned on either one or both sides of the wafer 11 to form a deep reactive ion etching (DRIE) mask. The mask prevents further lithography steps after the device layer 13 is etched to define the structure of the accelerometer 10. Trenches 26 (gaps 26) are etched on the front side of the masked wafer 11 using the DRIE mask.

As is shown in FIG. 4b, a LPCVD polysilicon layer 27 is uniformly deposited on the SOI wafer 11 to reduce the size of the capacitive gaps 26 and doped to reduce the resistivity. A very thin conformal protection layer (such as LPCVD oxide) may be deposited to prevent the polysilicon on the sidewalls from getting attacked by etchant agents while etching back polysilicon in the next step. A blanket etch removes polysilicon at the bottom of the trenches 26 (capacitive gaps 26) and provides isolation between pads 18 (electrodes 18) and fingers 17, 19. In case the conformal protection layer is deposited, it should be removed from the surfaces before performing the polysilicon blanket etch step. For very high aspect ratio capacitive gaps 26, the polysilicon at the bottom of the sense fingers cannot be removed from the top and consequently is etched from the back side. As is shown in FIG. 4c, the handle layer 12 is etched to expose the oxide buffer layer 14 from the back side of the wafer 12. A portion of handle layer 12 on the back side of the proof mass 15 remains intact to add a substantial amount of mass to the accelerometer 10.

The oxide buffer layer 14 is dry etched using an inductive plasma etching system, for example, and the accelerometer 10 is released. This fully-dry release process is a key to high-yield fabrication of extremely compliant structures with small capacitive gaps 26 without experiencing stiction problems caused by wet etching processes. The proof mass 15 is solid with no perforations to maximize sensitivity and minimize the mechanical noise floor per unit area. The residues of the oxide masking layer 25 are removed wherever the silicon is required to be exposed for electrical connection purposes.

An extra mask (not shown) may be used to reduce the height of the back-side seismic mass 15 (for packaging purposes). Also, the added mass of the proof mass 15 may be shaped to reduce the overall sensitivity of the accelerometer 10. In addition, other compatible materials may be used instead of polysilicon 27 for the purpose of gap-reduction (e.g. polysilicon-germanium, for example). A separate mask may be added for top side trench etching to define the tethers 16 after deposition of the polysilicon layer 27. In doing so, the width of the tethers 16 that determine the stiffness of the accelerometer 10 will not be affected by the deposited polysilicon layer 27.

Figure 4D:
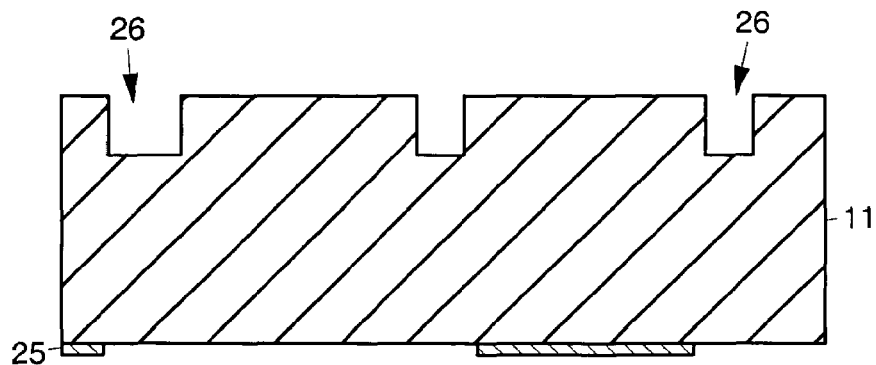
FIGS. 4d-4f illustrate an exemplary fabrication process flow for producing a differential capacitive silicon accelerometer.
Figure 4E:
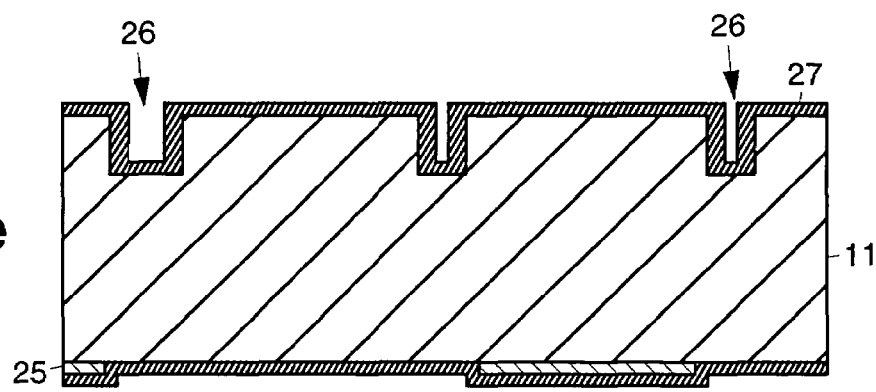
Figure 4F:
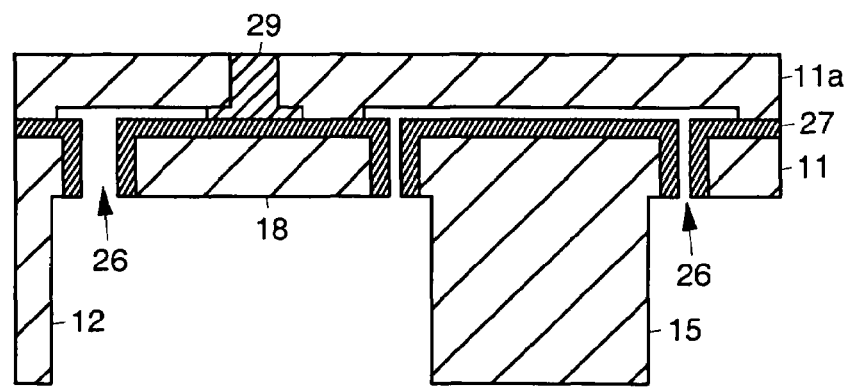

FIGS. 4d-4f illustrate an exemplary fabrication process flow for fabricating exemplary silicon accelerometers 10. The accelerometer fabrication process flow is as follows.

As is shown in FIG. 4d, a relatively thick oxide layer 25 is deposited/grown on either one or both sides of a low resistivity relatively thick silicon wafer 11 (silicon substrate 11) and patterned (only the bottom oxide mask layer 25 is shown), and the top side is etched using deep reactive ion etching (DRIE), for example. The deep reactive ion etching produces trenches 26 (capacitive gaps 26) adjacent the top surface of the silicon substrate 11.

As is shown in FIG. 4e, a LPCVD polysilicon layer 27 is deposited on the silicon substrate 11 to reduce the size of the capacitive gaps 26. The LPCVD polysilicon layer 27 is uniformly doped. A thin protection layer (such as LPCVD oxide) can be deposited to protect the sidewalls from being attacked while the polysilicon layer is etched from the back side in the consequent steps. This thin layer is etched back from the surfaces of the polysilicon (if deposited).

As is shown in FIG. 4f, a handle substrate 11a (e.g. glass or oxidized silicon) with interconnect through-holes is bonded to the top surface of the accelerometer. The cap substrate is previously patterned to carry shallow cavities above the movable parts of the structure. Electrical connections 29 to the electrodes is created through via holes in the substrate 11a and connect to the doped LPCVD polysilicon layer 27 on pads 18 formed in the lower substrate 11. The silicon substrate 11 and the polysilicon deposited 27 at the bottom of the trenches is etched from the back side using deep reactive ion etching (DRIE) tools, for example, to release the accelerometer 10. The etching leaves a portion of the bottom silicon substrate 11 as part of the proof mass 15.

Figure 5A:
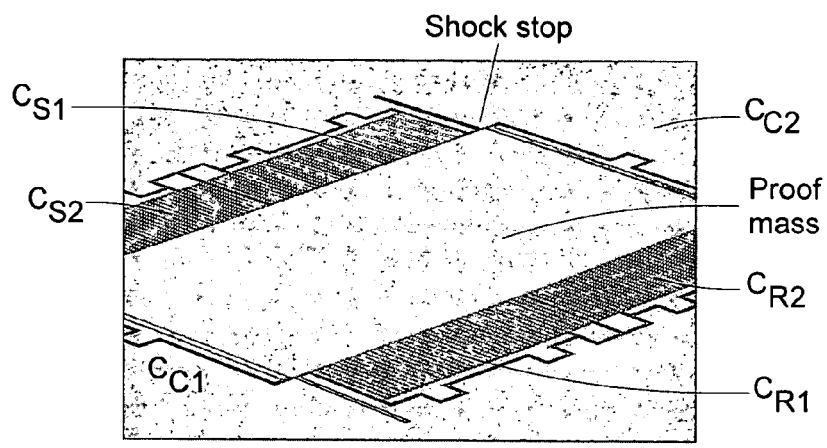
FIG. 5a is a SEM picture of an exemplary accelerometer from the top side.
Figure 5B:
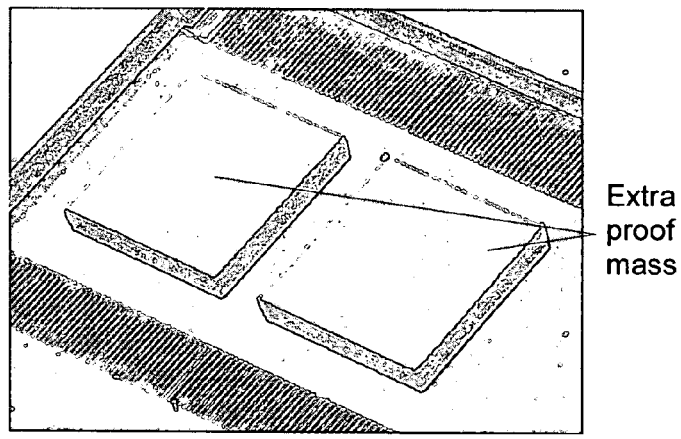
FIG. 5b is a SEM picture of an exemplary accelerometer from the bottom side showing extra proof mass.
Figure 5C:
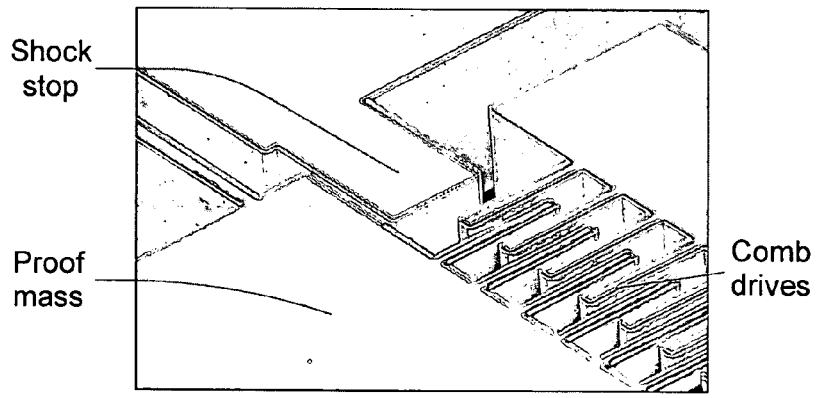
FIG. 5c is a SEM picture of an exemplary accelerometer showing the proof mass, shock stop and comb drives.
Figure 5D:
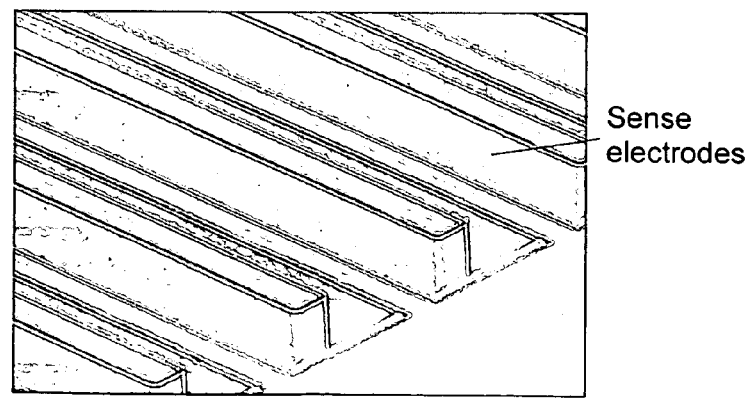
FIG. 5d is a SEM picture showing sense electrodes with a reduced gap size.

FIG. 5a is a SEM picture of an exemplary reduced-to-practice accelerometer 10 from the top side fabricated using the process described with reference to FIGS. 4a-4c. FIG. 5b is a SEM picture of the reduced-to-practice accelerometer 10 from the bottom side showing extra proof mass 15. FIG. 5c is a SEM picture of the reduced-to-practice accelerometer 10 showing the proof mass, shock stop and comb drives. FIG. 5d is a SEM picture showing sense electrodes of the reduced-to-practice accelerometer 10 with a reduced gap size.

The ability to control the amount of added mass is a powerful design parameter, which can be adjusted to achieve different sensitivities using the same top side device layout. Another important feature of the process flow discussed above is the gap reduction technique that utilizes conformal low pressure chemical vapor deposition (LPCVD) of polysilicon on the sidewalls of the trenches etched in the silicon. This fabrication method can also enable implementation of bi-axial and tri-axial accelerometers within a single embodiment.

The accelerometer 10 may be interfaced to a switched-capacitor charge amplifier integrated circuit (IC) 30 that eliminates the need for area-consuming reference capacitors. In this architecture, the reference capacitor is absorbed in the sense capacitance of the accelerometer 10 without compromising the sensitivity of the device or increasing area. The sense capacitance of the sensor is split into four identical sub-capacitances in a fully symmetric and differential manner (two increasing and two decreasing). The proof mass 11 is tied to a constant voltage source (half of the supply) at all times and is never clocked. This, in turn, simplifies the digital clock generator circuit and decreases the charge injection noise. By eliminating the need for reference capacitors and delayed version of the clock, our new interface architecture results in a significant reduction in the electronic die size. A correlated double sampling scheme may be used for strong suppression of the low-frequency flicker noise and offset. The interfacing is done through wire-bonds to the low noise and low power switched-capacitor IC implemented in a 2.5V 0.25 μm N-well CMOS. Alternatively, the interface circuit can be integrated with the accelerometer (or sensor) substrate on a common substrate to simplify packaging.

Figure 6A:
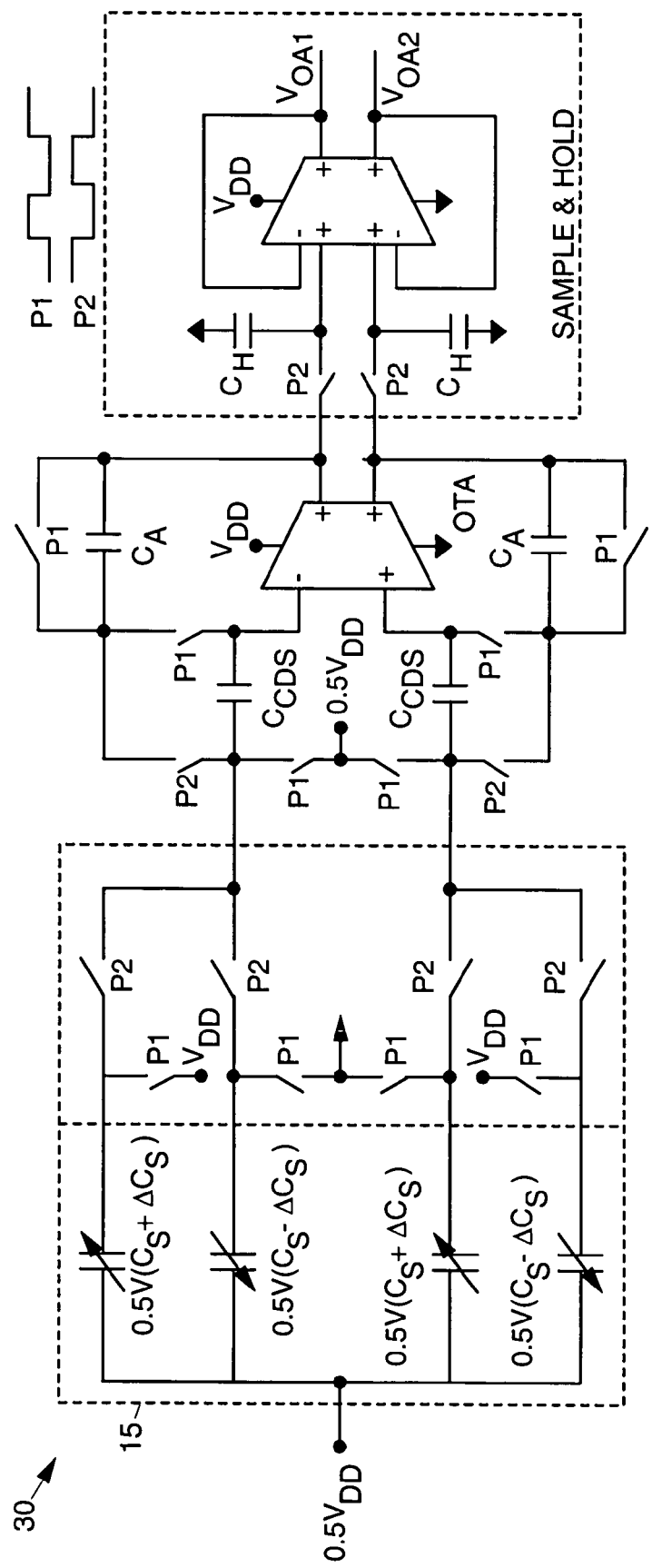
FIG. 6a is a schematic diagram of an exemplary interface circuit for use with the accelerometer.
Figure 6B:
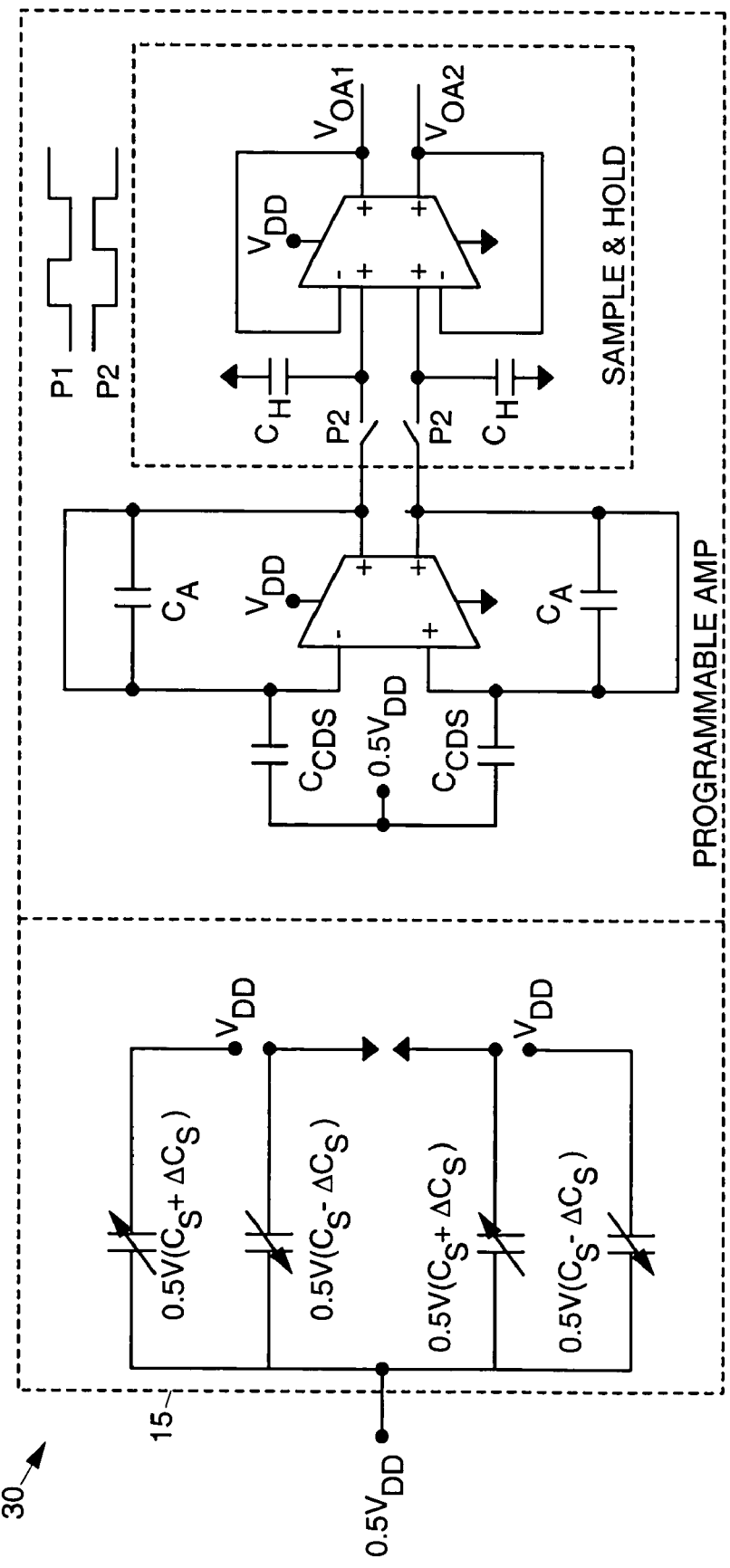
FIG. 6b is a diagram showing the exemplary interface circuit in a sampling phase.
Figure 6C:
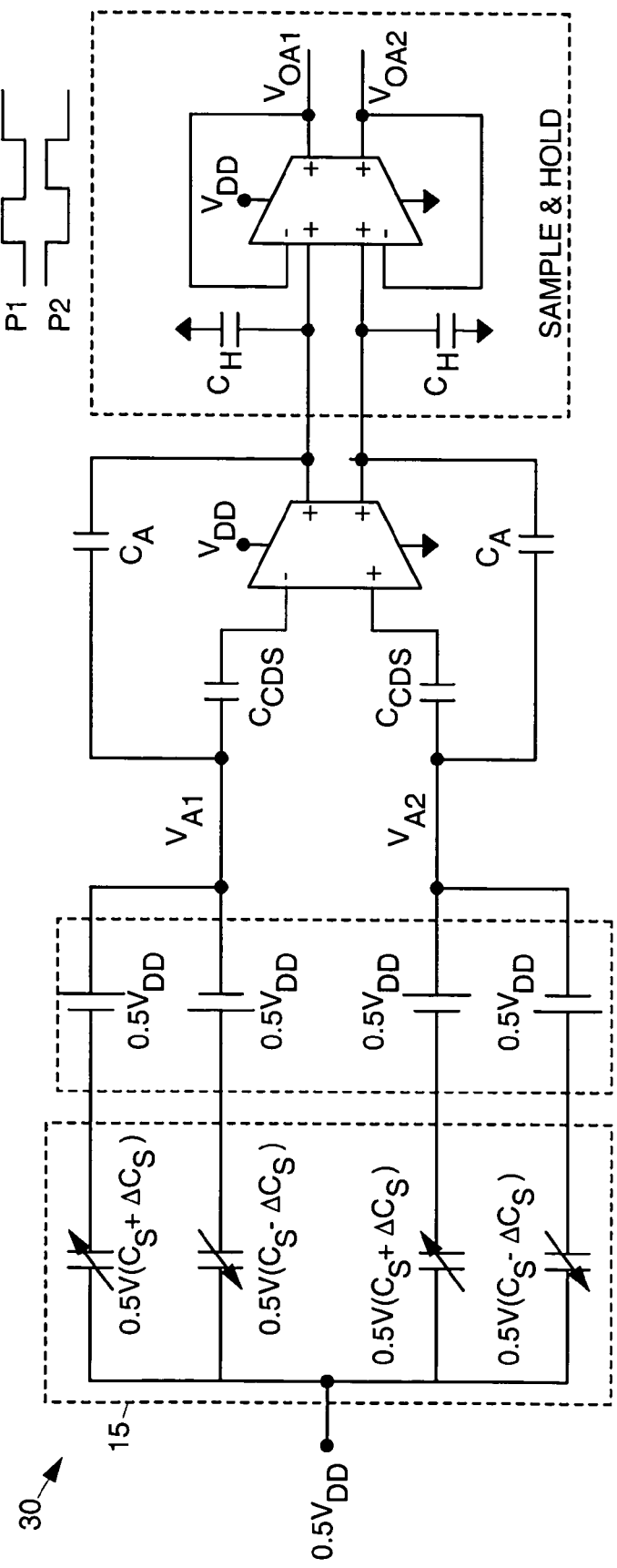
FIG. 6c is a diagram showing the exemplary interface circuit in an amplification phase.

A schematic diagram of an exemplary accelerometer interface IC 30, or circuit 30, is shown in FIG. 6a. A switched-capacitor charge amplifier 31 eliminates the need for reference capacitors and has virtually zero input offset voltage. This is discussed by B. Vakili Amini, S. Pourkamali, M. Zaman, and F. Ayazi, in "A new input switching scheme for a capacitive micro-g accelerometer," Symposium on VLSI Circuits 2004, pp. 310-313. FIG. 6b is a diagram showing the exemplary interface circuit 30 in a sampling phase. FIG. 6c is a diagram showing the exemplary interface circuit 30 in an amplification phase.

Previously reported switched-capacitor charge amplifiers for capacitive sensors required on-chip reference capacitors to set the input common mode voltage. See, for example, B. Vakili Amini, and F. Ayazi, "A 2.5V 14-bit Sigma-Delta CMOS-SOI capacitive accelerometer," IEEE J. Solid-State Circuits, pp. 2467-2476, December 2004, W. Jiangfeng, G. K. Fedder, and L. R. Carley, "A low-noise low-offset capacitive sensing amplifier for a 50-μg/$\sqrt{Hz}$ monolithic CMOS MEMS accelerometer," IEEE I Solid-State Circuits, pp. 722-730, May 2004, and H. Kulah, C. Junseok, N. Yazdi, and K. Najafi, "A multi-step electromechanical Sigma-Delta converter for micro-g capacitive accelerometers," ISSCC 2003, pp. 202-203. In the architecture disclosed herein, the reference capacitor is absorbed in the sense capacitance of the accelerometer 10 without compromising the sensitivity of the device or increasing area.

An exemplary interface IC 30 was fabricated using a 0.25 μm CMOS process operating from a single 2.5V supply and was wire-bonded to the accelerometer 10. A low power consumption of 6 mW was observed. The effective die area is about 0.65 mm$^2$. In order to reduce the CNEA and improve the dynamic range, low frequency noise and offset reduction techniques, i.e., correlated double sampling and optimized transistor sizing were deployed. Moreover, the differential input-output scheme reduces the background common mode noise signals. The measured sensitivity is 83 mV/mg and the interface IC output noise floor is −91 dBm/Hz at 10 Hz, corresponding to an acceleration resolution of 170 ng/$\sqrt{Hz}$. The IC output saturates with less than 20 mg (less than 10 from earth surface). The interface IC 30 has a chip area of 0.5×1.3 mm$^2$. An exemplary fabricated IC 30 had a power consumption of 6 mW and core area of 0.65 mm$^2$.

The resolution and sensitivity of the fully-dry-released SOI accelerometers 10 are each improved by about 100 times to achieve, for the first time, deep sub-micro-gravity resolution in a small footprint (<0.5 cm$^2$). The figure-of-merit, defined as the ratio of device sensitivity to its mechanical noise floor, is improved by increasing the size of the solid seismic mass 11 by saving part of the handle layer 13 attached to the proof mass 11 (as shown in FIG. 2). Also, capacitive gap sizes are reduced through deposition of the doped LPCVD polysilicon layer 16, which relaxes the trench etching process and allows for higher aspect ratios.

As was mentioned above, the sense capacitance is split into four substantially identical sub-capacitances in a fully symmetric and differential manner. Thus, the reference capacitor is integrated into the sense capacitance of the accelerometer 10 and this does not compromise sensitivity or increase its area. The proof mass 11 is tied to a constant voltage source at all times and is never switched. By eliminating the need for reference capacitors, the interface architecture results in a generic front-end with significant reduction in the electronic die size. The front-end IC 30 may be implemented using a 2.5V 0.25 μm 2P5M N-well CMOS process, for example. Correlated double sampling scheme (CDS) is used for strong suppression of the low-frequency flicker noise and offset.

The following are unique features of fabricated microaccelerometers 10. A two-mask process provides for high yield and a simple implementation. Fully-dry release provides for stictionless compliant devices. Gap size reduction provides for high capacitive sensitivity. Small aspect ratio trenches allow relaxed DRIE. Extra backside seismic mass provides for nano-gravity. No release perforation (solid proof mass) provides for maximum performance per unit area.

Thus, implementation and characterization of in-plane capacitive microaccelerometers 10 with sub-micro-gravity resolution and high sensitivity have been disclosed. The fabrication process produces stictionless accelerometers 10 and is very simple compared to conventional microaccelerometer fabrication techniques that use regular silicon substrates with multi-mask sets. These conventional techniques are discussed, for example, by P. Monajemi, and F. Ayazi, in "Thick single crystal Silicon MEMS with high aspect ratio vertical air-gaps," SPIE 2005 Micromachining/Microfabrication Process Technology, pp. 138-147, and J. Chae, H. Kulah, and K. Najafi., in "An in-plane high sensitivity, low-noise micro-g silicon accelerometer," MEMS 2003, pp. 466-469. The fully-dry release process provides for accelerometers 10 with maximum sensitivity and minimum mechanical noise floor per unit area. The accelerometers 10 may be interfaced with a generic sampled data front-end IC 30 that has the versatility of interfacing capacitive microaccelerometers 10 with different rest capacitors. Proper mechanical design keeps the accelerometers 10 in overdamped region in air that avoids unpredictable resonant response.

TABLE 2

Accelerometer and Interface IC Specifications

| Accelerometer | |
|---|---|
| Top-side roof mass dimensions | 7 mm × 5 mm × 120 μm |
| Extra seismic mass dimensions | 5 mm × 3 mm × 400 μm |
| Proof mass | 24 milli-gram |
| Sensitivity | 17 pF/g |
| Brownian noise floor | 100 nano-g/$\sqrt{Hz}$ |
| $f_{-3dB}$ (1$^{st}$-flexural) | 180 Hz |
| 2$^{nd}$-mode (out-of-plane) | 1300 Hz |
| Gap size | 5 μm |
| Interface IC | |
| Gain | 83 mV/milli-g |
| Output noise floor | −91 dBm @ 10 Hz |
| Min. detectable Accl. | 170 nano-g @ 10 Hz |
| Capacitive resolution | 2 aF/$\sqrt{Hz}$ @ 10 Hz |
| Power supply | GND-2.5 V |
| Power dissipation | 6 mW |
| Sampling frequency | 200 kHz |
| Die core area | 0.65 mm$^2$ |

The sub-micro-gravity accelerometers 10 have applications in measurement of vibratory disturbances on the platforms installed on earth, space shuttles, and space stations, as well as in inertial navigation.

The use of thick SOI substrates in implementing lateral capacitive accelerometers has the advantage of increased mass compared to the polysilicon surface micromachined devices, which results in reduced Brownian noise floor for these devices. However, bulk silicon accelerometers are typically limited by the electronic noise floor, which can be improved by increasing the sensitivity (delta(C)/g) of the micromachined device. This usually requires an increase in the capacitive area and a reduction in the stiffness of the device, which in turn increases the possibility of stiction.

Thus, 120 μm-thick high sensitivity silicon capacitive accelerometers 10 on low-resistivity SOI substrates 11 using a backside dry-release process have been disclosed that eliminates stiction along with the need for perforating the proof mass 15. A solid proof mass 15 with no perforations results in a smaller footprint for the sensor and an improved electromechanical design. An improved architecture interface circuit 30 is also disclosed that has no limitation of sensing large capacitive (>10 pF) microaccelerometers 10.

Thus, microaccelerometers and fabrication methods relating thereto have been disclosed. It is to be understood that the above-described embodiments are merely illustrative of some of the many specific embodiments that represent applications of the principles discussed above. Clearly, numerous and other arrangements can be readily devised by those skilled in the art without departing from the scope of the invention.

What is claimed is:

1. Sensing apparatus comprising:
   a substrate comprising a lower section and an upper section, the upper section comprising a plurality of tethers formed between selected lateral edges and a central region of the upper section, and a plurality of electrodes disposed along selected edges of the upper section;

a seismic mass comprising the central region of the upper section and a portion of the lower section disposed beneath the central region; and conductive material disposed along edges of gaps in the upper section defining the seismic mass that reduce respective sizes of the gaps.

2. The apparatus recited in claim 1 wherein the upper section of the substrate comprises a silicon device layer, the portion of the lower section comprises a silicon handle layer, and an insulating layer separates the device layer and the handle layer.

3. The apparatus recited in claim 1 wherein two pairs of symmetrically changing capacitances are defined that have a common node at the seismic mass.

4. The apparatus recited in claim 1 wherein the plurality of electrodes comprise parallel plate capacitive electrodes, in which the capacitance changes due to changes in inter-electrode gap spacing.

5. The apparatus recited in claim 1 wherein the plurality of electrodes comprise comb capacitive electrodes, in which the capacitance changes due to change in overlap area of comb fingers.

6. The apparatus recited in claim 1 wherein an input switching scheme is provided in a switched-capacitor charge amplifier that interfaces with two pairs of symmetrically changing capacitances.

7. The apparatus recited in claim 6 wherein the two pairs of symmetrically changing capacitances comprise capacitance bridge reference capacitors that are integrated into a sense capacitance of the apparatus.

8. The apparatus recited in claim 2 wherein the device layer comprises a plurality of shock stops disposed adjacent edges of the seismic mass that prevent adjacent electrodes from contacting each other when the apparatus undergoes acceleration.

9. The apparatus recited in claim 1 wherein the conductive material comprises doped polysilicon.

10. The apparatus recited in claim 2 wherein the plurality of tethers comprise doped polysilicon disposed on portions of the silicon device layer.

11. The apparatus recited in claim 1 wherein selection of respective masses of the seismic mass and the tethers allows independent tailoring of the mass and operating frequency of the apparatus.

12. Sensing apparatus comprising:

a silicon-on-insulator substrate comprising a lower silicon handle layer and an upper silicon device layer separated by an insulating layer, which device layer comprises a plurality of tethers formed between selected lateral edges and a central region of the device layer, and a plurality of parallel plate electrodes disposed along selected edges of the device layer;

a seismic mass comprising a central region of the device layer, a portion of the insulating layer disposed beneath the central region of the device layer, and a portion of the handle layer disposed beneath the portion of the insulating layer; and doped polysilicon disposed along edges of gaps in the device layer defining the seismic mass which reduce respective sizes of the gaps.

* * * * *